US012757668B2

(12) United States Patent
Yen et al.

(10) Patent No.: US 12,757,668 B2
(45) Date of Patent: Oct. 6, 2026

(54) WET CLEANING TOOL AND METHOD

(71) Applicant: Taiwan Semiconductor Manufacturing Company, Ltd., Hsinchu (TW)

(72) Inventors: Hsu Tung Yen, Kaohsiung (TW); Chen-Chieh Chiang, Kaohsiung City (TW); Ling-Sung Wang, Tainan (TW); Che-Li Lin, Kaohsiung City (TW); Bo Hsiang Huang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/847,208

(22) Filed: Jun. 23, 2022

(65) Prior Publication Data

US 2023/0415204 A1 Dec. 28, 2023

(51) Int. Cl.
*H01L 21/67* (2006.01)
*B05B 1/14* (2006.01)
(Continued)

(52) U.S. Cl.
CPC ............ *H10P 72/0414* (2026.01); *B05B 1/14* (2013.01); *B05B 1/20* (2013.01); *B05B 7/00* (2013.01);
(Continued)

(58) Field of Classification Search
CPC ............ B05B 7/00–32; B08B 3/00–14; B08B 5/00–046; H01L 21/67051;
(Continued)

(56) References Cited

U.S. PATENT DOCUMENTS

2002/0074020 A1* 6/2002 Ono .................. H01L 21/67034 134/21
2002/0187442 A1* 12/2002 Gurer ................ H01L 21/67051 430/434

(Continued)

FOREIGN PATENT DOCUMENTS

CN 100343943 C 10/2007
CN 101536161 B 4/2011

(Continued)

OTHER PUBLICATIONS

First office action received in the counterpart Taiwan application 112119911, mailed on Mar. 28, 2024.

*Primary Examiner* — Kaj K Olsen
*Assistant Examiner* — Richard Z. Zhang
(74) *Attorney, Agent, or Firm* — Kilpatrick Townsend & Stockton LLP LLP

(57) ABSTRACT

A semiconductor cleaning tool is provided. The cleaning tool comprises a nozzle. The nozzle is connected with a first inlet to receive a carrier gas and a second inlet to receive one or more fluids. The nozzle comprises a gas passageway connected to the first inlet; and fluid passageway connected to the second inlet. The gas passageway comprises gas passage branches and the fluid passageway comprises fluid passage branches. The gas passage branches and the fluid passage branches are arranged interweavingly in the nozzle. Individual gas/fluid passage branches are controllable inde-cently and separately including a flow rate, a temperature, an on/off state, a type of fluid(s) or carrier gas, a time period, a supply mode, and/or any other aspects of spraying the fluid(s) and carrier gas through the individual gas passage branches and the individual fluid passage branches.

20 Claims, 5 Drawing Sheets

(51) Int. Cl.

| | |
|---|---|
| ***B05B 1/20*** | (2006.01) |
| ***B05B 7/00*** | (2006.01) |
| ***B05B 7/02*** | (2006.01) |
| ***B05B 7/12*** | (2006.01) |
| ***B08B 3/02*** | (2006.01) |
| ***H10P 70/00*** | (2026.01) |
| ***H10P 72/00*** | (2026.01) |
| *B05B 1/00* | (2006.01) |

(52) U.S. Cl.
CPC .................. *B05B 7/02* (2013.01); *B05B 7/12* (2013.01); *B08B 3/022* (2013.01); *H10P 70/23* (2026.01); *H10P 70/27* (2026.01); *B05B 1/00* (2013.01)

(58) Field of Classification Search
CPC ......... H01L 21/6708; H01L 21/02041–02101; H01L 21/00–86; H10P 72/0414; H10P 72/0424
See application file for complete search history.

(56) References Cited

U.S. PATENT DOCUMENTS

| | | | | | |
|---|---|---|---|---|---|
| 2003/0024553 | A1* | 2/2003 | Miyazaki | B08B 3/02 | 134/30 |
| 2003/0205253 | A1* | 11/2003 | Shibagaki | H01L 21/6708 | 134/153 |
| 2004/0020520 | A1* | 2/2004 | Kim | H01L 21/67051 | 134/133 |
| 2005/0072526 | A1* | 4/2005 | Nguyen | C23C 18/168 | 257/E21.174 |
| 2005/0127037 | A1* | 6/2005 | Tannous | B08B 7/0035 | 216/62 |
| 2005/0183666 | A1* | 8/2005 | Tsuji | H01J 37/3244 | 118/715 |
| 2005/0276921 | A1* | 12/2005 | Miya | H01L 21/6875 | |
| 2006/0177586 | A1* | 8/2006 | Ishida | H01L 21/67184 | 427/430.1 |
| 2007/0183775 | A1* | 8/2007 | Mitsuhashi | H01L 21/67051 | 396/611 |
| 2008/0041430 | A1* | 2/2008 | Cho | H01L 21/67051 | 134/58 R |
| 2009/0285991 | A1* | 11/2009 | Kitano | H01L 21/6838 | 118/56 |
| 2009/0305178 | A1* | 12/2009 | Nakagawa | F23D 11/107 | 431/159 |
| 2010/0108108 | A1* | 5/2010 | Hayashi | H01L 21/02063 | 134/115 R |
| 2010/0313915 | A1* | 12/2010 | Fujiwara | H01L 21/67051 | 134/102.1 |
| 2012/0186607 | A1* | 7/2012 | Higashijima | H01L 21/68728 | 134/102.1 |
| 2014/0026926 | A1* | 1/2014 | Semmelrock | H10P 72/0414 | 134/30 |
| 2014/0273489 | A1* | 9/2014 | Wang | H10P 50/242 | 438/716 |
| 2014/0338706 | A1* | 11/2014 | Nonaka | H01L 21/67051 | 134/30 |
| 2016/0240413 | A1* | 8/2016 | Kobayashi | H01L 21/67109 | |
| 2016/0298241 | A1* | 10/2016 | Yoon | C03C 17/28 | |
| 2017/0316958 | A1* | 11/2017 | Jung | H10P 72/0404 | |
| 2018/0151394 | A1* | 5/2018 | Hatano | B08B 5/023 | |
| 2019/0311938 | A1* | 10/2019 | Chen | H01L 21/68735 | |
| 2021/0379611 | A1* | 12/2021 | Liu | B05B 17/0646 | |
| 2022/0208563 | A1* | 6/2022 | Negoro | H01L 21/68742 | |
| 2023/0384029 | A1* | 11/2023 | Kang | H01L 21/68721 | |

FOREIGN PATENT DOCUMENTS

| | | | | |
|---|---|---|---|---|
| CN | 102763199 | B | | 1/2016 |
| CN | 112845305 | A | * | 5/2021 |
| CN | 114367488 | A | * | 4/2022 |
| JP | 2018065109 | A | * | 4/2018 |
| KR | 20060125315 | A | * | 12/2006 |
| KR | 20170071922 | A | * | 6/2017 |
| KR | 20210030144 | A | * | 3/2021 |
| TW | 495805 | B | | 7/2002 |
| TW | I248108 | B | | 1/2006 |
| TW | I411474 | B | | 10/2013 |

* cited by examiner

WET CLEANING TOOL AND METHOD

BACKGROUND

Semiconductor wafers may be manufactured using a chemical vapor deposition (CVD) process. In such a process, the silicon structure of a typical semiconductor wafer is built-up using Silane (SiH4) and semiconductor properties are created by interstitially depositing elements such as Arsenic and Phosphorous. The sources for these elements, commonly called doping agents, may be the hydrides Arsine (AsH3) and Phosphine (PH3). These doping agents are pyrophoric and toxic. Therefore, the doping agents are scrubbed away when the semiconductor wafers are evacuated from a CVD reactor.

In addition to the above, semiconductor wafers may be subjected to Chemical Mechanical Processing (CMP) during fabrication. After such a process is performed, contaminants may remain on the wafer. Like the doping agents, these contaminants may be scrubbed away prior to further semiconductor wafer processing steps.

Cleaning of surfaces in semiconductor device processing has been of critical importance since the late 1950s and early 1960s. It is now well known that the device performance, reliability, and product yield of Si circuits are critically affected by the presence of chemical contaminants and particulate impurities on the wafer or device surface. The reduction of stability, reliability, and device or circuit yield due to impurities incorporated during processing established that effective and efficient cleans were imperative. The criticality of cleaning increased as feature sizes decreased, and aspect ratios and the number of process steps for state-of-the-art devices increased. Undercutting or etching of a thin surface region (e.g., less than 10 nanometer) to promote and facilitate removal of residues, particles, and atomic species can be unacceptable when films with thicknesses in the few nanometer range are invoked, ultra-shallow junctions are present, or porous materials are used.

An objective of wafer cleaning and surface conditioning is to remove particle and chemical impurities from the semiconductor surface without damaging or altering the substrate surface. The surface of the wafer must not be affected in such a manner that roughness, pitting, or corrosion negates the results of the cleaning process. Plasma, dry-physical, wet chemical, vapor phase, and supercritical fluid methods can be used to achieve these objectives. An extensive array of equipment is available for implementing the various processes for integrated circuit manufacturing applications. A traditional approach of pre-thermal wafer cleaning and surface conditioning is based on aqueous-chemical (fluid) processes that typically use hydrogen peroxide (H2O2) mixtures.

Technical jargon used in the IC surface preparation community often refers to wafers as "FEOL" and "BEOL" to specify the stage in the processing. "FEOL" typically refers to wafers in the "front end of line," meaning wafers in the initial stages of processing. These wafers feature only single crystal or polycrystalline Si (polySi) with or without SiO2 (silicon dioxide) and Si3N4 (silicon nitride) layers or patterns, without exposed metal areas. Reactive chemicals with aqueous solutions can be used for cleaning and conditioning these corrosion resistant materials. Cleaning at the early stages is typically done prior to gate oxide deposition and high-temperature processing, such as thermal oxidation and diffusion. The elimination of contaminants before these process steps is especially critical to prevent impurity diffusion into the substrate materials.

"BEOL" typically refers to wafers in the "back end of line," in the processing. Cleaning of these wafers is much more restrictive because metal areas may be exposed, such as Cu (copper), Al (aluminum), or W (tungsten) metallization, possibly in conjunction with low-density or porous low-κ (dielectric constant) films. Dry cleaning methods based on plasma chemistry, chemical vapor-phase reactions, and cryogenic aerosol techniques may be used to remove organic residues and particulate contaminants. Aqueous/organic solvent mixtures and other innovative approaches may also be used that will not attack exposed sensitive materials.

Liquid processes for wafer cleaning and surface conditioning are based on the use of aqueous chemicals, organic solvents, or mixtures of the two. If aqueous chemicals are used the process is properly called "wet-chemical." These processes are typically applied for FEOL wafers. The mechanism of liquid cleaning can be purely physical dissolution and/or chemical reaction dissolution. Chemical etching occurs when materials are removed by a chemical transformation to soluble species. Traditionally, chemical etching is expected to remove substantial quantities of a material, such as a deposit film on a substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
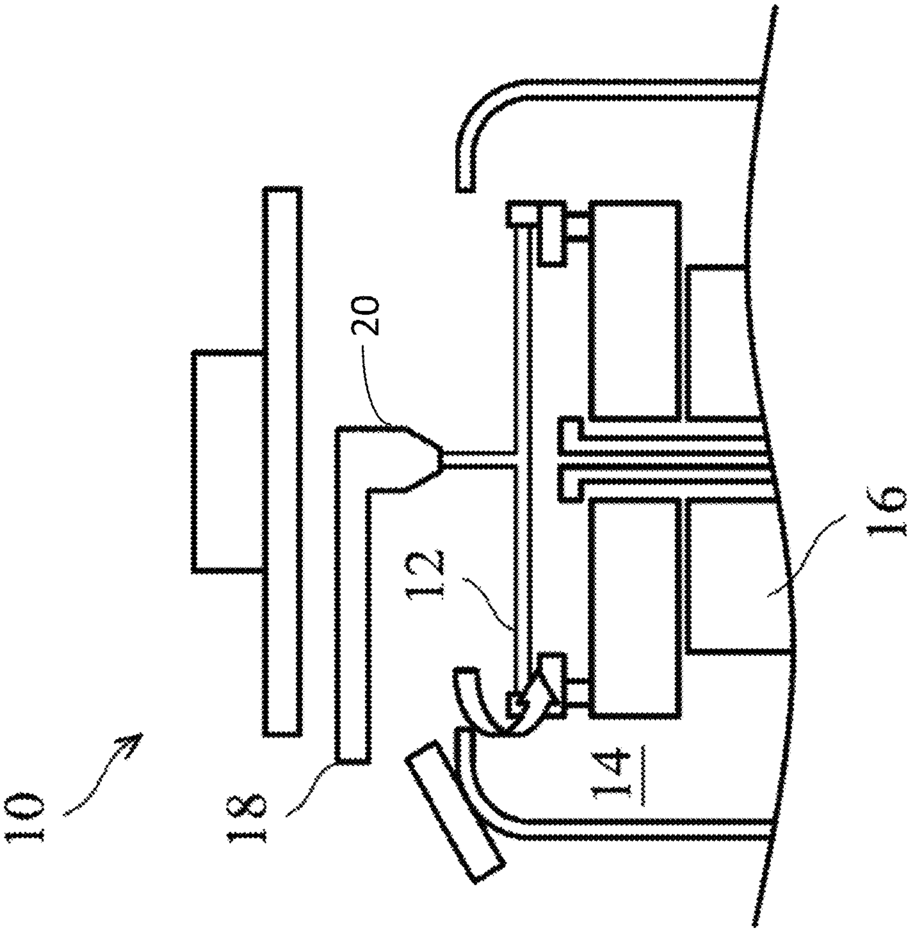
FIG. 1A illustrates a wet cleaning tool for illustrating the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Throughout this disclosure, various chemical elements are described in full names and/or symbols. For accuracy and completeness, the following chemical elements table is provided for a given chemical element described in the present disclosure:

CHEMICAL ELEMENTS

| ELEMENT | SYMBOL | ATOMIC NUMBER | ATOMIC WEIGHT[1] |
|---|---|---|---|
| actinium | Ac | 89 | (227) |
| aluminum | Al | 13 | 26.98154 |
| americium | Am | 95 | (243) |
| antimony | Sb | 51 | 121.760 |
| argon | Ar | 18 | 39.948 |
| arsenic | As | 33 | 74.92160 |
| astatine | At | 85 | (210) |
| barium | Ba | 56 | 137.33 |
| berkelium | Bk | 97 | (247) |
| beryllium | Be | 4 | 9.012182 |
| bismuth | Bi | 83 | 208.98040 |
| bohrium | Bh | 107 | (264) |
| boron | B | 5 | 10.81 |
| bromine | Br | 35 | 79.904 |
| cadmium | Cd | 48 | 112.41 |
| calcium | Ca | 20 | 40.078 |
| californium | Cf | 98 | (251) |
| carbon | C | 6 | 12.011 |
| cerium | Ce | 58 | 140.116 |
| cesium | Cs | 55 | 132.90545 |
| chlorine | Cl | 17 | 35.453 |
| chromium | Cr | 24 | 51.996 |
| cobalt | Co | 27 | 58.93320 |
| copernicium | Cn | 112 | (285) |
| copper | Cu | 29 | 63.546 |
| curium | Cm | 96 | (247) |
| darmstadtium | Ds | 110 | (269) |
| dubnium | Db | 105 | (262) |
| dysprosium | Dy | 66 | 162.50 |
| einsteinium | Es | 99 | (252) |
| erbium | Er | 68 | 167.259 |
| europium | Eu | 63 | 151.964 |
| fermium | Fm | 100 | (257) |
| flerovium | Fl | 114 | (289) |
| fluorine | F | 9 | 18.998403 |
| francium | Fr | 87 | (223) |
| gadolinium | Gd | 64 | 157.25 |
| gallium | Ga | 31 | 69.723 |
| germanium | Ge | 32 | 72.64 |
| gold | Au | 79 | 196.96657 |
| hafnium | Hf | 72 | 178.49 |
| hassium | Hs | 108 | (277) |
| helium | He | 2 | 4.002602 |
| holmium | Ho | 67 | 164.93032 |
| hydrogen | H | 1 | 1.0079 |
| indium | In | 49 | 114.818 |
| iodine | I | 53 | 126.90447 |
| iridium | Ir | 77 | 192.217 |
| iron | Fe | 26 | 55.845 |
| krypton | Kr | 36 | 83.80 |
| lanthanum | La | 57 | 138.90547 |
| lawrencium | Lr | 103 | (262) |
| lead | Pb | 82 | 207.2 |
| lithium | Li | 3 | 6.941 |
| livermorium | Lv | 116 | (293) |
| lutetium | Lu | 71 | 174.967 |
| magnesium | Mg | 12 | 24.305 |
| manganese | Mn | 25 | 54.93805 |
| meitnerium | Mt | 109 | (268) |
| mendelevium | Md | 101 | (258) |
| mercury | Hg | 80 | 200.59 |
| molybdenum | Mo | 42 | 95.94 |
| moscovium | Mc | 115 | (289) |
| neodymium | Nd | 60 | 144.242 |
| neon | Ne | 10 | 20.180 |
| neptunium | Np | 93 | (237) |
| nickel | Ni | 28 | 58.6934 |
| nihonium | Nh | 113 | (286) |
| niobium | Nb | 41 | 92.90638 |
| nitrogen | N | 7 | 14.0067 |
| nobelium | No | 102 | (259) |
| oganesson | Og | 118 | (294) |
| osmium | Os | 76 | 190.23 |
| oxygen | O | 8 | 15.9994 |
| palladium | Pd | 46 | 106.42 |
| phosphorus | P | 15 | 30.973762 |
| platinum | Pt | 78 | 195.081 |
| plutonium | Pu | 94 | (244) |
| polonium | Po | 84 | (209) |
| potassium | K | 19 | 39.0983 |
| praseodymium | Pr | 59 | 140.90765 |
| promethium | Pm | 61 | (145) |
| protactinium | Pa | 91 | (231) |
| radium | Ra | 88 | (226) |
| radon | Rn | 86 | (222) |
| roentgenium | Rg | 111 | (280) |
| rhenium | Re | 75 | 186.207 |
| rhodium | Rh | 45 | 102.90550 |
| rubidium | Rb | 37 | 85.4678 |
| ruthenium | Ru | 44 | 101.07 |
| rutherfordium | Rf | 104 | (261) |
| samarium | Sm | 62 | 150.36 |
| scandium | Sc | 21 | 44.95591 |
| seaborgium | Sg | 106 | (266) |
| selenium | Se | 34 | 78.96 |
| silicon | Si | 14 | 28.0855 |
| silver | Ag | 47 | 107.8682 |
| sodium | Na | 11 | 22.989769 |
| strontium | Sr | 38 | 87.62 |
| sulfur | S | 16 | 32.07 |
| tantalum | Ta | 73 | 180.9479 |
| technetium | Tc | 43 | (98) |
| tellurium | Te | 52 | 127.60 |
| tennessine | Ts | 117 | (293) |
| terbium | Tb | 65 | 158.92535 |
| thallium | Tl | 81 | 204.3833 |
| thorium | Th | 90 | (232) |
| thulium | Tm | 69 | 168.93421 |
| tin | Sn | 50 | 118.71 |
| titanium | Ti | 22 | 47.867 |
| tungsten | W | 74 | 183.84 |
| uranium | U | 92 | (238) |
| vanadium | V | 23 | 50.9415 |
| xenon | Xe | 54 | 131.29 |
| ytterbium | Yb | 70 | 173.04 |
| yttrium | Y | 39 | 88.90585 |
| zinc | Zn | 30 | 65.39 |
| zirconium | Zr | 40 | 91.224 |

[1]Weights are based on the naturally occurring isotope compositions and scaled to $^{12}C = 12$. For elements lacking stable isotopes, the mass number of the most stable one is shown in parentheses.

Wet cleaning processes can be categorized as pre-process cleaning or post-process cleaning steps. Further, they can be divided between the front end of line (FEOL) and back end of line (BEOL), the former essentially comprising steps to form the active devices and the latter steps to connect them by multiple levels of metal wiring. Historically, BEOL cleaning steps have been accomplished using organic solvents as opposed to aqueous chemistries, due to the incompatibility of typical FEOL aqueous cleaning solutions with the metal wiring. This is also changing, however, and aqueous cleaning has become increasingly used in the BEOL. It is understood that novel wet cleaning tools and methods in accordance with the present disclosure are not intended to be limited to a specific type of wet cleaning. That is, it is contemplated that the novel wet cleaning tools and methods disclosed herein can be used in FEOL or BEOL.

FIG. 1A illustrates a wet cleaning tool 10 for illustrating the present disclosure. Wet cleaning tool 10 is suitable for cleaning and drying a semiconductor wafer 12 as depicted. As shown, the wet cleaning tool 10 includes a chamber 14 configured to receive one or more of the semiconductor wafers 12. For ease of illustration, one of the semiconductor wafers is depicted in the wet cleaning tool 10 in FIG. 1A. Even so, it should be recognized that several semiconductor wafers 12 may be loaded into the chamber 14 simultaneously in some embodiments.

As shown in FIG. 1A, the wet cleaning tool 10 is equipped with a drive mechanism 16 configured to rotate the semiconductor wafer 12 when operated. In some embodiments, the drive mechanism 16 rotates the semiconductor wafer 12 in a range of about 300 revolutions per minute (RPMs) to about 1600 revolutions per minute. Still shown in FIG. 1A, the wet cleaning tool 10 is equipped with an inlet 18 having a nozzle 20. In some embodiments, the inlet 18 is configured to spray de-ionized water (e.g., DIW or DI water) and/or a carrier gas (e.g., N2) onto the semiconductor wafer 12. As shown, in an embodiment the inlet 18 is generally disposed in the center of the chamber 14. Even so, the inlet 18 may be otherwise located or positioned in other embodiments.

Figure 1B:
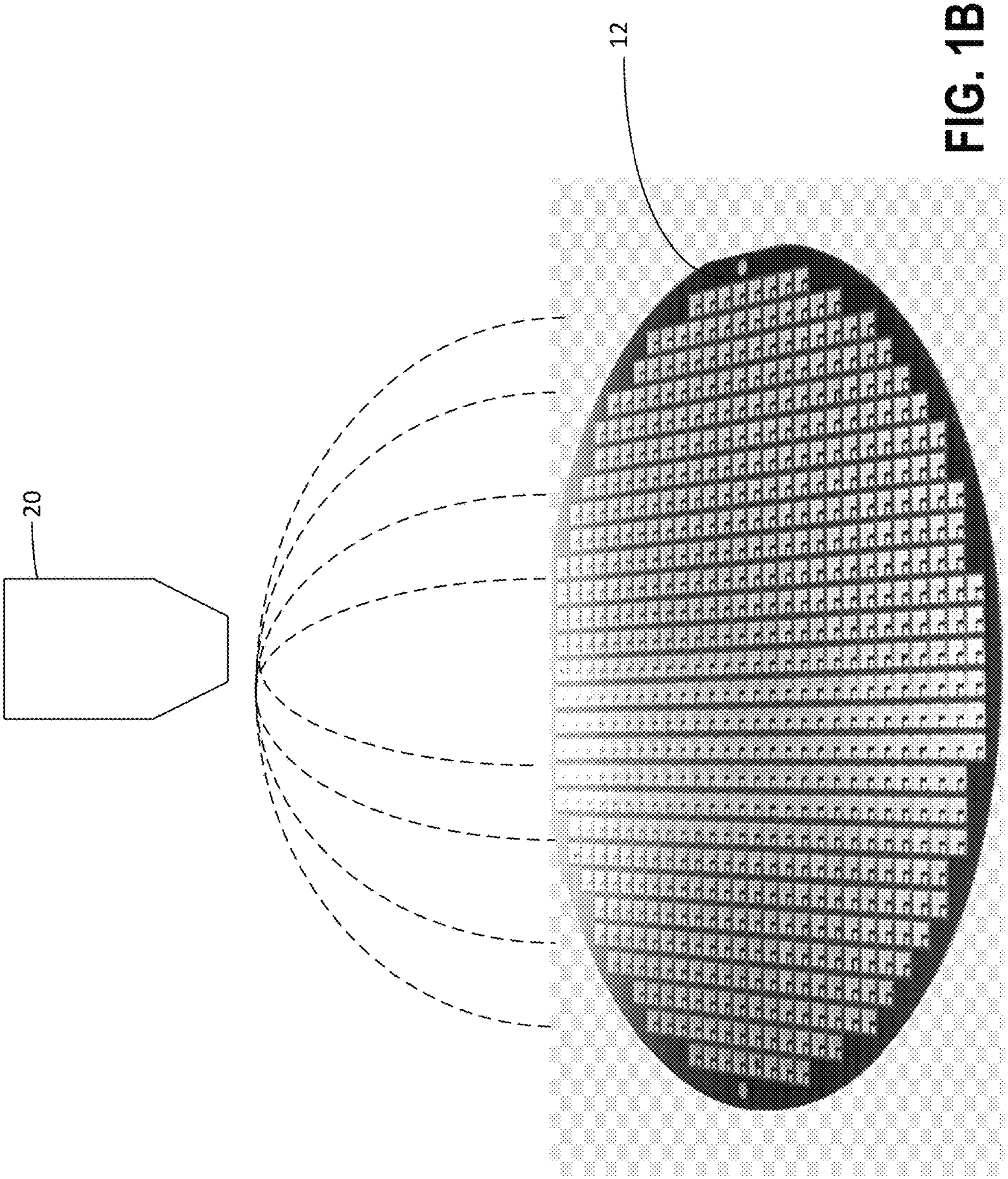
FIG. 1B illustrates the nozzle shown in FIG. 1A sprays fluids and/or the carry gas onto a wafer to clean the wafer.

FIG. 1B illustrates the nozzle 20 shown in FIG. 1A sprays fluids and/or the carry gas onto the wafer 12 to clean the wafer 12. This cleaning may be performed at various stages during fabrication of the wafer 12. For example, after forming one or more metal gates for individual devices on the wafer 12, the fluids may be sprayed onto the wafer 12 using the wet cleaning tool 10 through the nozzle 20. It is observed that during this spraying, pockets of areas located on the edge of wafer 12 are often not covered by the spraying as much as other areas on the wafer 12, even though the drive mechanism 16 spins the wafer 12 to make the wafer 12 covered by the spraying so to facilitate the wet cleaning.

One insight provided by the present disclosure is that an improvement to the nozzle 20 can be made such that both fluid and carrier gas are introduced into inlet 18 and sprayed onto the wafer 12 in an interwoven fashion at a same time or different times. The carrier gas is chosen such that it does not make chemical reaction with the fluids when sprayed onto wafer 12. Examples of the carrier gas includes Nitrogen, Argon, Dry-Air and/or any other types of carrier gas. A purpose of spraying the fluids and the carrier gas in the interwoven fashion is to use the carrier gas to push surrounding fluids outwards on the wafer 12 after the carrier gas and the fluids are sprayed onto wafer 12 by nozzle 20. In this way, fluid distribution is flattened on the wafer 12 to achieve more or less of a uniform fluid distribution on the wafer 12 to help address the observed edge clean issue mentioned above.

Figure 2A:
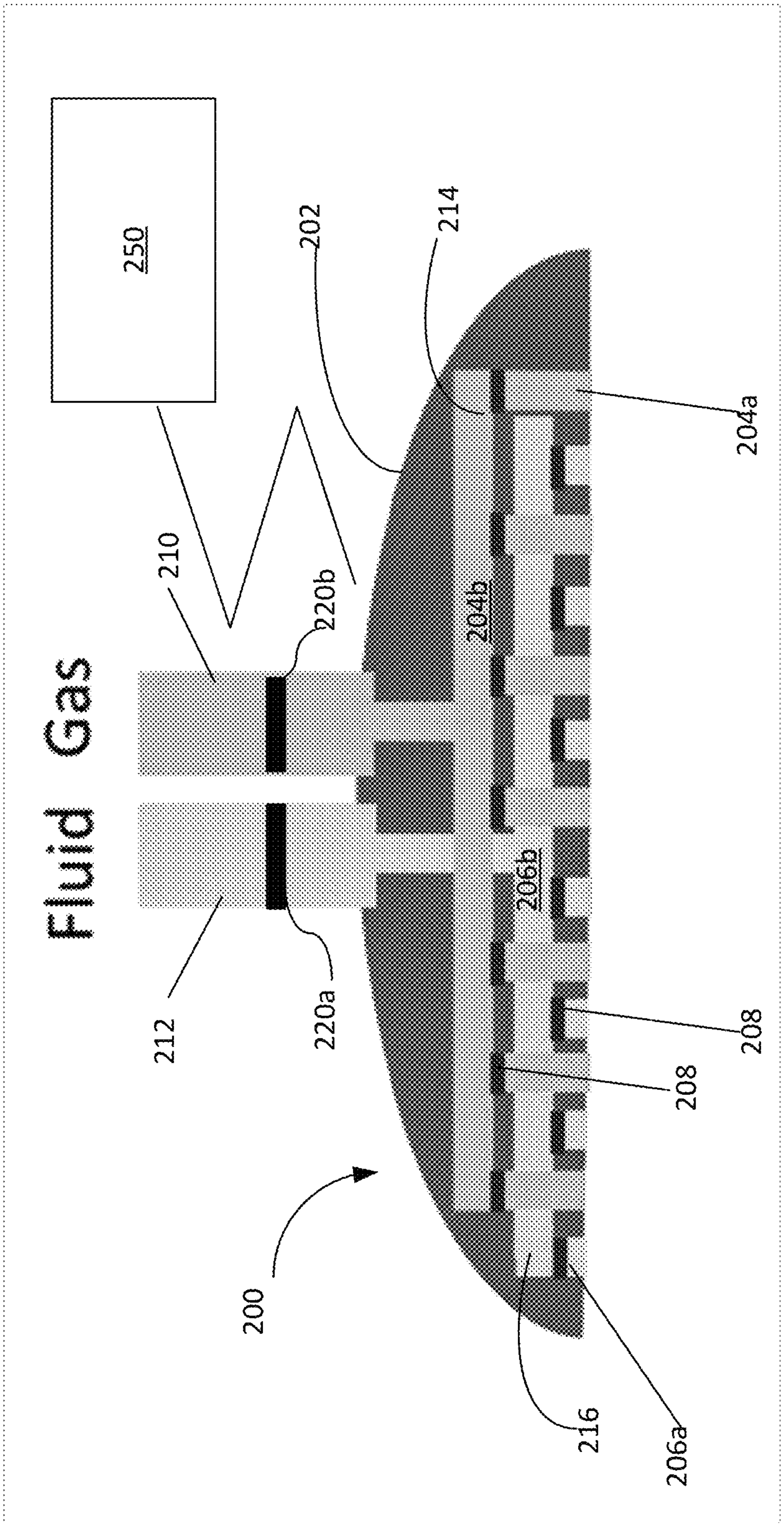
FIG. 2A illustrates an example nozzle for a wet cleaning tool, such as the wet cleaning tool shown in FIG. 1A.

Attention is now directed to FIG. 2A, where an example nozzle 200 for a wet cleaning tool, such as the wet cleaning tool 10 shown in FIG. 1A, is illustrated. In this example, the nozzle 200 is connected with two inlets, first inlet 210 and second inlet 212. The first inlet 210 is configured to supply a carrier gas and the second inlet 212 is configured to supply one or more fluids or mixture of fluids. Example of the fluids that can be supplied by the second inlet 212 include acetic acid, citric acid, hydrochloric acid (HCl), hydrogen peroxide ($H_2O_2$), and/or any other type of fluids. The fluid(s) supplied by the second inlet 212 may be referred to as a reactant in a sense that it is capable of having a chemical reaction with a metal on the wafer 12 to dissolve/remove contamination particles on the wafer 12. In one example, the fluid supplied by the second inlet 212 is a cleaning solution comprises TiN, $H_2O_2$, and HCl. After this cleaning solution is sprayed onto the wafer 12, the TiN and $H_2O_2$ becomes $TiO_x$ and $H_2O$ due to the chemical reaction, and the HCl dissolves the $TiO_x$ for cleaning effects.

As mentioned, an insight of the present disclosure is that the carrier gas supplied by first inlet 210 can be so chosen that it does not make chemical reaction with the fluid(s) supplied by the second inlet 212. Both the fluid(s) supplied by the second inlet 212 and the carrier gas supplied by the first inlet 210, in this example, are passed into nozzle 200 in separate passageways 216 and 214. The first type of passageway in the nozzle 200 is referred to as a carrier gas passageway 214; and the second type of passageway in the nozzle 200 is referred to as a fluid passageway 216. In this example, the carrier gas passageway 214 and a fluid passageway 216 are separate and isolated for one another such that the carrier gas and fluid(s) therein do not communicate with one another. In another words, the carrier gas in the carrier gas passageway 214 does not enter the fluid passageway 216; and the fluid(s) in the fluid passageway 216 does not enter the carrier gas passageway 214. As shown, the carrier gas passageway 214 and fluid passageway 216 are surrounded by casing material 202 that provides structure support and facilitates the separation and isolation between the two passageways in the nozzle 200.

Attention is now directed to the individual carrier gas and fluid passageways. As can be seen, in this example, the carrier gas passageway 214 comprises a main gas passage **204*b* and multiple gas passage branches 204*a*. Similarly, in this example, the fluid passageway 216 comprises a main fluid passage 206*b* and multiple fluid passage branches 206*a*. As shown in this example, the main gas passage 204*b* is arranged over the main fluid passage 206*b*; and the individual gas passage branches 204*a* are arranged to interleave with the fluid passage branches 206*a*. A given one of the gas passage branches 204*a* has a valve 208 and a gas outlet; and given one of the fluid passage branches 206*a* also has a valve 208 and a fluid outlet. The valves 208 in the individual fluid passage branches 206*a* and the individual gas passage branches 204*a* are controllable to open and shut independently from each other. For example, a programmable controller 250 shown in FIG. 2A can be configured to control the valves 208 and thus control a flow of the fluids and/or the carrier gas to be released by the nozzle 200 at a given point of time. For example, one or more of the gas passage branches 204*a* can be controlled to spray the carrier gas in a same time period, while one or more of other gas passage branches 204*a* are controlled to be shut off in that time period. As another example, one or more of the gas passage branches 204*a* can be controlled to spray the carrier gas in a same time period as one or more of the fluid passage branches 206*a*** sprays the fluid(s).

In various embodiments, an individual gas passageway or fluid passageway is configured with a separate nozzle as shown in this example, such as nozzle **220*a* and 220*b***. In those embodiments, the separate nozzle in the fluid or gas passageway is configured to have a pusher structure such that it is controllable supply a gas or fluid in the gas or fluid passageway at a controllable flow rate. However, it should be understood that this is not intended to be limiting. In some other embodiments, the gas or fluid flow control is achieved at individual gas or fluid passage branches. For example, individual gas or fluid passage branches in those examples can have their own nozzles for controlling flow rate of gas or fluid sprayed therefrom.

An insight provided by the present disclosure is that wet cleaning typically relies on chemical reactions that remove material and/or contaminants on the wafer 12. Such reactions are typically functions of a flow rate, timing, temperature, concentration of the fluid(s) supplied by the fluid passageway 216, and/or any other factors. One or more of such a factor may be controlled and balanced in supplying the fluid(s) to clean the wafer 12. Similarly, one or more of such a factor may be controlled and balanced in supplying the carrier gas for the flattening a distribution of the fluid(s) on the wafer 12 and push the sprayed fluid(s) towards edges of the wafer 12. For example, a flow rate of the carrier gas can be controlled by controlling an amount of the valves 208 in the individual gas passage branches 204*a* to be in an open state and the rest in an off state. As another example, one or more locations of the carrier gas to be sprayed onto the wafer 12 can be controlled by spraying the carrier gas through the valves 208 at the gas passage branches 204*a* corresponding to those locations on wafer 12, while not supplying the carrier gas at any other gas passage branches 204*a* in the nozzle 200. Such control can be useful to facilitate a fine-tuned cleaning operation using the carrier gas, which may provide an atomic force spray or physical force onto the wafer 12 at desired location(s) and/or timing on the wafer 12, and/or at one or more desired flow rate on the wafer 12.

Other aspects that can be controlled by a programmable controller 250 for the fluid(s) and/or carrier gas supplied by the fluid passageway 216 and carrier gas passageway 214 respectively may include a supply mode of the fluid(s) and/or the carrier gas, a temperature of the fluid(s) and/or the carrier gas, and/or any other aspects. For the supply mode, the following considerations are contemplated: the carrier gas is supplied at a continuous flow for a first time period, and/or at a non-continuous flow for a second time period; the fluid(s) is supplied at a continuous flow for a third time period, and/or at a non-continuous flow for a fourth time period. In an example implementation, an individual one of the gas passage branches 204*a* has its own supply mode (e.g., continuous and non-continuous), and an individual one of the fluid passage branches 206*a* has its own supply mode (e.g., continuous and non-continuous). The individual supply modes of the individual gas passage branches 204*a* and fluid passage branches 206*a* can be controlled independently by the programmable controller 250 in the example implementation. For instance, the programmable controller 250 can be configured to control the individual valves 208 in the individual gas passage branches 204*a* and fluid passage branches 206*a* to achieve desired supplied modes for those branched.

In some implementations, a temperature of the fluid(s) supplied by the fluid passageway 216 is controlled by the programmable controller 250 to be different from a temperature of the carrier gas supplied by the carrier gas passageway 214. In one implementation, this temperature difference is that the temperature of the carrier gas is at least 30%, 20%, 10% or 5% higher or lower than the temperature of the fluid(s). In another implementation, this temperature difference is that the temperature of the carrier gas and the temperature of the fluid(s) is at least within 30%, 20%, 10% or 5% from one another.

In some implementations, the wet cleaning tool 10 with a nozzle 200 in accordance with the present disclosure can be used in an integrated process for semiconductor device fabrication involving the wafer 12. In those implementations, the integrated process involves a film deposition onto the wafer 12 and a resulting interface of the wafer 12 thereafter is dependent on a cleanliness of a surface of the wafer 12. An example, without limitation, involves wafer cleaning treatment following a fabrication step on wafer 12. In that example, information regarding a film thickness of the wafer 12 is collected for determining various parameters regarding the fluid(s) and/or the carrier gas to clean the wafer 12, such as a flow rate, a time period, one or more locations (e.g., which branch to be open/shut), a type of the fluid(s), a type of the carrier gas, and/or any other parameters.

Figure 2B:
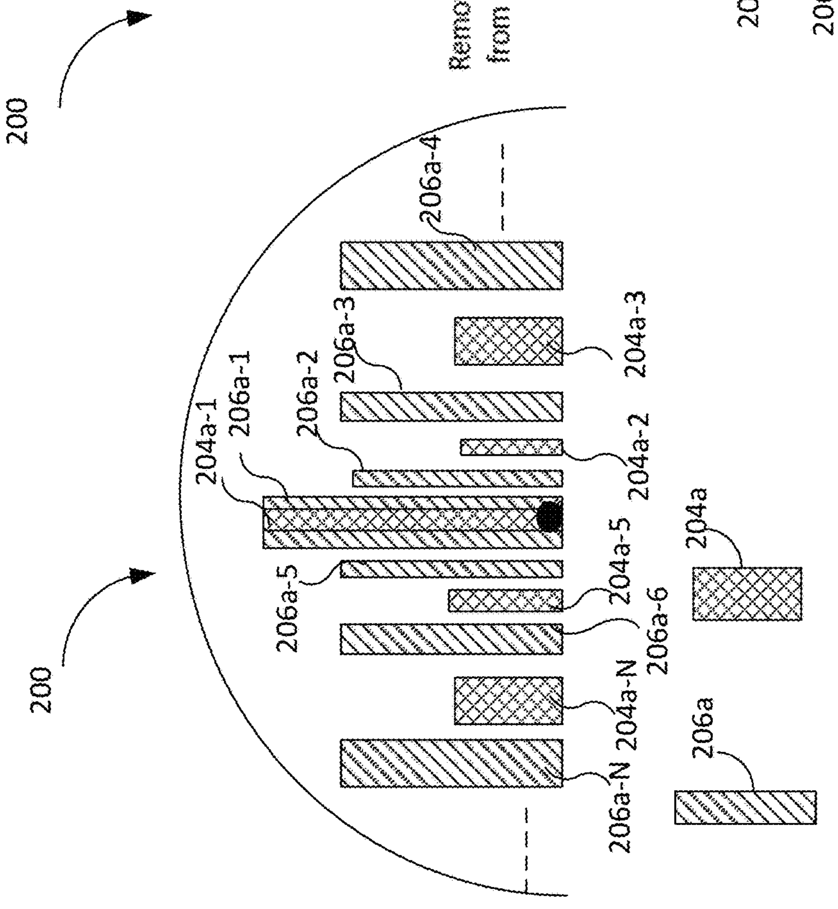
FIG. 2B illustrates a side view of an example configuration of the nozzle shown in FIG. 2A.
Figure 2C:
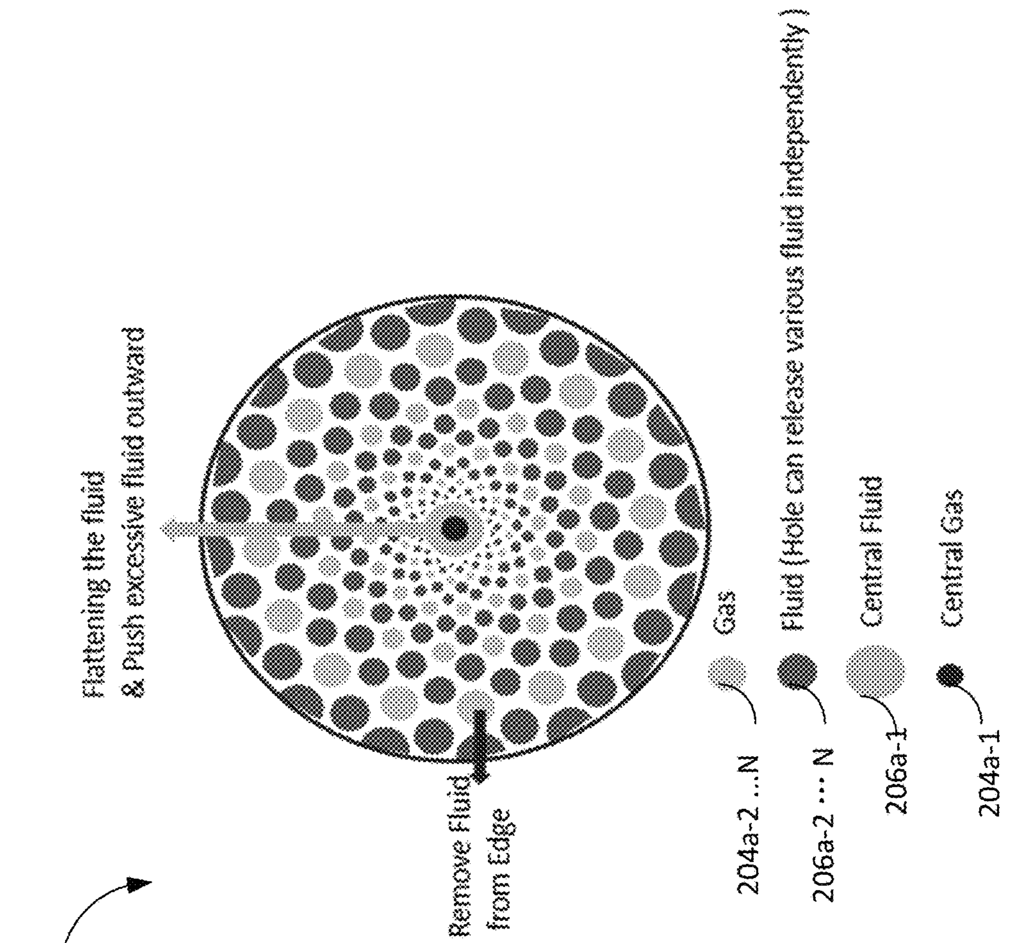
FIG. 2C illustrates a bottom view of the example configuration of the nozzle shown in FIG. 2B.

Attention is now directed to FIGS. 2B and 2C. FIG. 2B illustrates a side view of an example configuration of the nozzle 200 shown in FIG. 2A. FIG. 2C illustrates a bottom view of the example configuration of the nozzle 200 shown in FIG. 2B. In this example configuration of the nozzle 200, the individual gas passage branches 204 *a* and fluid passage branches 206 *a* are arranged in an interwoven fashion from a center of the nozzle 200 towards edges of the nozzle 200. As can be seen in FIG. 2A, in this example configuration, there is a central fluid passage branch 206 *a*-1 and a central gas passage branch 204 *a*-1. In this example configuration, the central gas passage branch 204 *a*-1 is arranged within the central fluid passage branch 206 *a*-1. In this example configuration, the central gas passage branch 204 *a*-1 and the central fluid passage branch 206 *a*-1 isolated from one another. As shown in FIG. 2C, the central gas can help push fluid(s) sprayed onto the wafer 12 outwards.

From the center, as illustrated in FIG. 2B, the individual gas passage branches 204*a*-2 . . . N and the individual fluid passage branches 206*a* are arranged interweavingly such that a given one of the fluid passage branches 206*a* is in between two neighboring gas passage branches 204*a*, and vice versa. In this example configuration, a diameter of the individual fluid passage branches 206*a* increases gradually from the center of the nozzle 200 towards edges. For example, as shown in this example configuration, a diameter of the fluid passage branch 206*a*-2 is less than a diameter of the fluid passage branch 206*a*-3, which is less than the fluid passage branch 206*a*-4 and so on. Similarly, a diameter of the gas passage branch 204*a*-2 is less than a diameter of the gas passage branch 204*a*-3, which is less than the gas passages further towards the edge and so on. In some implementations, a diameter of two neighboring gas passage branch and fluid passage branch may be the same to form a pair. In those implementations, the diameter of the pairs gradually increases from the center of the nozzle 200 towards edges of the nozzle 200. In this example configuration, individual gas passage branches and fluid passage branches are spaced apart at more or less the same distance. However, this is not intended to be limiting. It is contemplated that in some embodiments, the individual gas passage branches and fluid passage branches are spaced apart at varying distances. For example, they may be arranged more densely at a center area of the nozzle 200 and more sparsely towards the edges of the nozzle 200, or vice versa.

In FIG. 2C, it can be seen that the individual gas passage branches and fluid passage branches in the nozzle 200 in this example configuration, as a whole, form a pattern like a honeycomb. This pattering of individual gas passage branches and fluid passage branches in the nozzle 200 may be referred to a honeycomb configuration. However, this is not intended to be limiting, other patterning of the individual gas passage branches and fluid passage branches in the nozzle 200 are contemplated. One skilled in the art would understand to vary the patterning the individual gas passage branches and fluid passage branches in the nozzle 200 to achieve desired cleaning effect(s) by virtue of independently controlling the individual gas passage branches and fluid passage branches and thereby controlling a flow rate, volume, timing, location temperature and/or any other aspects of the carrier gas and fluid(s) sprayed onto wafer 12.

In various implementations, types of fluids in the individual fluid passage branches 206*a* can be controlled to be different at different time periods. In some implementations, a type of the fluid(s) in the central fluid passage branch 206*a*-1 is different from a type of the fluid(s) in one or more other fluid passage branches 206*a*-2 . . . N in the nozzle 200. Similarly, in some implementations, a type of the carrier gas in the central fluid passage branch 206*a*-1 is different from a type of the carrier gas in one or more other gas passage branches 204*a*-2 . . . N in the nozzle 200.

Figure 3:
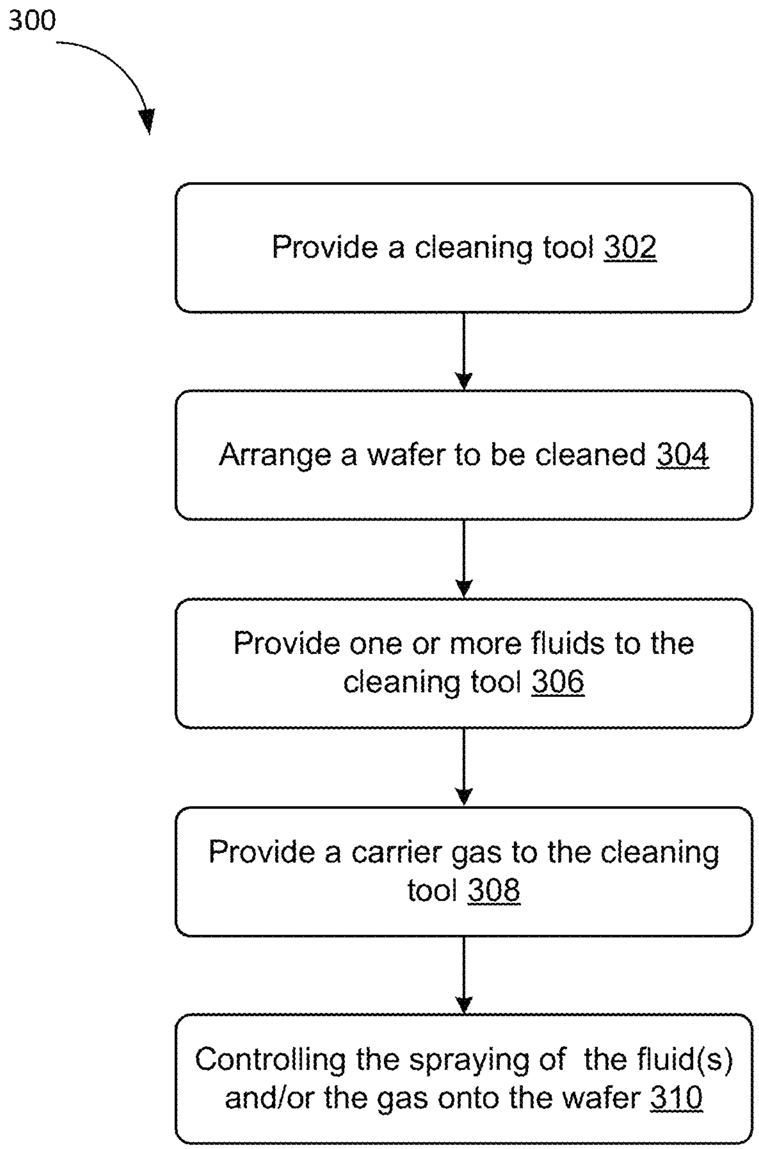
FIG. 3 is a flow chart of an embodiment of a method of cleaning a semiconductor substrate according to one or more aspects of the present disclosure.

FIG. 3 is a flow chart of an embodiment of a method 300 of cleaning a semiconductor substrate according to one or more aspects of the present disclosure. FIGS. 1-2 illustrate an example of a wet cleaning tool 10 having a nozzle 200 which may be used to perform one or more steps of the method of FIG. 3.

At 302, a clean tool such as the wet cleaning tool 10 shown in FIGS. 1-2 is provide. As shown in those figures, the wet cleaning tool 10 includes a nozzle 200 configured to spray one or more fluids and carrier gas onto a wafer for cleaning the wafer. As described and illustrated herein, the nozzle 200 is configured to be connected with a carrier gas passageway 214 and a fluid passageway 216 in the wet cleaning tool 10. As also described and illustrated herein, the carrier gas passageway 214 and the fluid passageway 216 are separate and isolated from one another such that the fluid(s) supplied in the fluid passageway 216 does not communicate with the carrier gas supplied in the carrier gas passageway 214.

As still described and illustrated herein, the fluid passageway 216 has a main fluid passage 206*b* and multiple fluid passage branches 206*a*; and the gas passageway 214 has a main gas passage 204*b* and multiple gas passage branches 204*a*. In various embodiments, the multiple fluid passage branches 206*a* and the multiple gas passage branches 204*a* are arranged in the nozzle 200 in an interleaving fashion. One example configuration of such an arrangement is shown in FIGS. 2B-C.

As described and illustrated herein, individual gas passage branches 204*a* are configured to be controlled independently; and similarly, individual fluid passage branches 206*a* are configured to be controlled independently. Aspects of such control can include a flow rate, a temperature, an on/off state, a type of fluid(s) or carrier gas, a time period, a supply mode, and/or any other aspects of supplying the fluid(s) and carrier gas through the individual gas passage branches 204*a* and the individual fluid passage branches 206*a*.

At 304 *a* wafer is arranged to be cleaned by the cleaning tool provided at 302. The wafer may have a diameter of approximately 200 mm, approximately 300 mm, approximately 450 mm, or other suitable diameter. In embodiments, the wafer diameter may be larger than 450 mm. The wafer may include any number of semiconductor devices or portion(s) thereof. In an embodiment, the wafer includes regions having Ge, GaAs, InP, InGaAs, and/or other suitable III-V semiconductor material(s). The III-V materials may be disposed on or in the wafer in regions where a channel of a semiconductor device (e.g., transistor) will be disposed. In an embodiment, the III-V semiconductor material is provided on a top surface of the semiconductor substrate. The top surface may be exposed to a spray from the wafer cleaning tool. For example, the III-V semiconductor material may be epitaxially grown on (and/or above) the substrate. In a further embodiment, the III-V semiconductor material may be deposited on the wafer using metalorganic vapor phase epitaxy (MOVPE) or metalorganic chemical vapor deposition (MOCVD) processes. An example of the wafer is shown in FIG. 1B.

At 306, one or more fluids is provided to the cleaning tool. As illustrated and described herein, the fluid(s) provided at 306 may include an acid and de-ionized (DI) water. The fluid(s) may be a dilute acid. In an embodiment, the fluid(s) provided includes a dilute aqueous hydrochloric acid (HCl). In other embodiments, the fluid(s) includes acetic acid, citric acid, HCl and/or other suitable acids having a pH of less than approximately 7. The dilute acid may serve to reduce any metallic contamination on the wafer. The acid may be approximately 0.5 wt % acid or less (aqueous in DI water). In a further embodiment, the fluid(s) provided includes between approximately 0.3 wt % and approximately 0.0003 wt % of acid (e.g., HCl) in de-ionized (DI) water. The fluid(s) provided may be between approximately 4 Celsius and approximately 80 Celsius. In one example, the fluid(s) provide is a cleaning solution comprises TiN, H2O2, and HCl. After this cleaning solution is sprayed onto the wafer provided at 304, the TiN and H2O2 becomes TiOx and H2O due to the chemical reaction, and the HCl dissolves the TiOx for cleaning effects.

At 308, a carrier gas is provided to the cleaning tool. As described and illustrated herein, the carrier gas provided at 308 may include nitrogen (N2) gas. In other embodiments, the carrier gas may include air, argon or other inert gas. The carrier gas may be provided at a high-pressure (e.g., greater than 760 torr).

At 310, one or more parameters of the carrier gas provided at 308 and/or of the fluid(s) provided at 306 are controlled for spraying the carrier gas and/or the fluid(s) onto the wafer provided at 304. As described and illustrated herein, the one or more parameters controlled at 310 include a flow rate, a temperature, an on/off state, a type of fluid(s) or carrier gas, a time period, a supply mode, and/or any other aspects of spraying the fluid(s) and carrier gas through the individual gas passage branches 204*a* and the individual fluid passage branches 206*a*. In various embodiments, the fluid sprayed onto the semiconductor device is distributed non-linearly due to different flow rate at different locations on the semiconductor device caused by the novel cleaning tool nozzle structure and control illustrated and described herein. In some embodiments, the distribution of the fluid or gas sprayed by the cleaning tool at a given moment is controlled based on a pattern density of the fluid previously sprayed onto to semiconductor device or based on a pattern density of structures already on the semiconductor device.

In various embodiments, a semiconductor cleaning apparatus is provided, in those embodiments, the semiconductor cleaning apparatus comprises a first inlet configured to receive a carrier gas, a second inlet configured to receive one or more fluids, a first nozzle connected with the first inlet and a second nozzle connected with the second inlet. In those embodiments, the first nozzle is configured to spray the carrier gas onto a substrate of a semiconductor device and the second nozzle is configured to spray the one or more fluids onto the substrate of the semiconductor device. In those embodiments, the cleaning apparatus further comprise a gas passageway connected to the first inlet, and a fluid passageway connected to the second inlet. Still in those embodiments, the gas passageway comprises at least one gas passage branch including a first gas passage branch, and the fluid passageway comprises at least one fluid passage branch including a first fluid passage branch. In those embodiments, the first gas passage branch is arranged neighboring the first fluid passage branch.

In various embodiments, a method for cleaning a semiconductor device is provided. In those embodiments, the method comprises providing a semiconductor cleaning apparatus. In those embodiments, the semiconductor apparatus has a first nozzle connected with the first inlet and a second nozzle connected with the second inlet, first nozzle being configured to spray the carrier gas onto a substrate of a semiconductor device and the second nozzle being configured to spray the one or more fluids onto the substrate of the semiconductor device. The semiconductor cleaning apparatus further comprises: a gas passageway connected to the first inlet, and the second nozzle comprises a fluid passageway connected to the second inlet. The gas passageway comprises at least one gas passage branch including a first gas passage branch, and the fluid passageway comprises at least one fluid passage branch including a first fluid passage branch, the first gas passage branch being arranged neighboring the first fluid passage branch. In those embodiments, the method further comprises: arranging the semiconductor device to be cleaned by the semiconductor cleaning apparatus; providing one or more fluids to the semiconductor cleaning apparatus; providing a carrier gas to the semiconductor cleaning apparatus; and controlling spraying of the one or more fluids and the carrier gas onto the substrate of semiconductor device. In those embodiments, the controlling includes: controlling the carry gas to cause the one or more fluids to be non-linearly distributed on the semiconductor device.

In various embodiments, a nozzle is provided. In those embodiments, the nozzle comprises a gas passageway, and a fluid passageway. In those embodiments, the gas passageway comprises gas passage branches includes a first gas passage branch and a second gas passage branch, and the fluid passageway comprises fluid passage branches including a first fluid passage branch and a second fluid passage branch, the first gas passage branch being arranged neighboring the first fluid passage branch, and the second gas passage branch being arranged neighboring the second fluid passage branch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor cleaning apparatus comprising:

a carrier gas source configured to provide a carrier gas; and a nozzle structure comprising:

a first inlet in communication with the carrier gas source and configured to receive the carrier gas;

a second inlet configured to receive one or more fluids;

a first nozzle connected with the first inlet and a second nozzle connected with the second inlet, the first nozzle being configured to spray the carrier gas onto a substrate of a semiconductor device and the second nozzle being configured to spray the one or more fluids onto the substrate of the semiconductor device; and a gas passageway connected to the first inlet, and a fluid passageway connected to the second inlet, wherein the gas passageway comprises multiple elongated gas passage branches including a first elongated gas passage branch and a second elongated gas passage branch, each elongated gas passage branch has a first end connected to a main gas passage and a second end connected to a gas opening, and the fluid passageway comprises multiple elongated fluid passage branches including a first elongated fluid passage branch, each of the multiple elongated fluid passage branches has a first end connected to a main fluid passage and a second end connected to a fluid opening, and wherein the multiple elongated gas passage branches and the multiple elongated fluid passage branches are arranged in an interwoven honeycomb pattern, such that a given one of the multiple elongated gas passage branches is surrounded by six of the multiple elongated fluid passage branches, and a gap between the given one of the multiple elongated gas passage branches and an adjacent one of the multiple elongated fluid passage branches is less than a gap between the given one of the multiple elongated gas passage branches and its nearest elongated gas passage branch.

2. The semiconductor cleaning apparatus of claim 1, wherein the multiple elongated gas passage branches and the multiple elongated fluid passage branches are arranged in an array in an alternate fashion.

3. The semiconductor cleaning apparatus of claim 1, wherein the first nozzle includes a first valve adjustable to cause a non-linear gas distribution on the substrate of the semiconductor device.

4. The semiconductor cleaning apparatus of claim 3, wherein a carrier gas distribution is adjustable based on a pattern density on the substrate of the semiconductor device.

5. The semiconductor cleaning apparatus of claim 1, wherein the multiple elongated gas passage branches have a higher number density at a center area of the first nozzle than at edge areas of the first nozzle, and the multiple elongated fluid passage branches have a higher number density at a center area of the second nozzle than at edge areas of the second nozzle.

6. The semiconductor cleaning apparatus of claim 1, wherein a portion of the multiple elongated fluid passage branches is disposed at an outermost peripheral region of the nozzle structure.

7. The semiconductor cleaning apparatus of claim 1, wherein a central elongated gas passage branch of the multiple elongated gas passage branches is vertically aligned with a central elongated fluid passage branch of the multiple elongated fluid passage branches such that a first carrier gas stream flowing through the central elongated gas passage branch is vertically aligned with a first fluid stream flowing through the central elongated fluid passage branch.

8. A nozzle disposed inside a substrate processing chamber of a semiconductor apparatus, the nozzle comprising:

a gas passageway in communication with a carrier gas source of the semiconductor apparatus to receive a carrier gas provided by the carrier gas source and sprayed onto a semiconductor wafer, wherein the gas passageway comprises multiple elongated gas passage branches, each elongated gas passage branch has a first end connected to a main gas passage and a second end connected to a gas opening;

a fluid passageway in communication with a fluid source of the semiconductor apparatus to receive a fluid provided by the fluid source and sprayed onto the semiconductor wafer, wherein the fluid passageway comprises multiple elongated fluid passage branches, each elongated fluid passage branch has a first end connected to a main fluid passage and a second end connected to a fluid opening; and a programmable controller configured to control supply modes of the multiple elongated gas passage branches and the multiple elongated fluid passage branches independently, wherein the carrier gas and the fluid are sprayed simultaneously onto the semiconductor wafer so that the carrier gas pushes the fluid outwards on the semiconductor wafer, wherein the multiple elongated gas passage branches and the multiple elongated fluid passage branches are arranged in an interwoven honeycomb pattern, and wherein the programmable controller adjusts a distribution of the carrier gas based on a pattern density of structures already on the semiconductor wafer.

9. The nozzle of claim 8, wherein the multiple elongated gas passage branches including a first elongated gas passage branch and a second elongated gas passage branch, the first elongated gas passage branch and the second elongated gas passage branch are controllable independently such that a flow rate in the first elongated gas passage branch and a flow rate in the second elongated gas passage branch are controllable independently.

10. The nozzle of claim 8, wherein a given one of the multiple elongated gas passage branches is surrounded by six of the multiple elongated fluid passage branches.

11. The nozzle of claim 10, wherein a gap between the given one of the multiple elongated gas passage branches and an adjacent one of the multiple elongated fluid passage branches is less than a gap between the given one of the multiple elongated gas passage branches and its nearest elongated gas passage branch.

12. The nozzle of claim 8, wherein the multiple elongated fluid passage branches including a first elongated fluid passage branch and a second elongated fluid passage branch, the first elongated fluid passage branch is closer to a center of the nozzle than the second elongated fluid passage branch, wherein a diameter of the first elongated fluid passage branch is less than a diameter of the second elongated fluid passage branch.

13. The nozzle of claim 8, wherein the multiple elongated gas passage branches and the multiple elongated fluid passage branches are arranged in an array in an alternate fashion.

14. A semiconductor apparatus comprising:

a chamber configured to receive a semiconductor wafer during a semiconductor fabrication process; and a semiconductor cleaning apparatus comprising:

a carrier gas source configured to provide a carrier gas;

a first inlet in communication with the carrier gas source and configured to receive the carrier gas;

a second inlet configured to receive one or more fluids; and a first nozzle connected with the first inlet and a second nozzle connected with the second inlet, the first nozzle being configured to spray the carrier gas onto the semiconductor wafer and the second nozzle being configured to spray the one or more fluids onto the semiconductor wafer, wherein the carrier gas and the one or more fluids are sprayed simultaneously onto the semiconductor wafer so that the carrier gas pushes the one or more fluids outwards on the semiconductor wafer; and a gas passageway connected to the first inlet, and a fluid passageway connected to the second inlet, wherein the gas passageway comprises multiple elongated gas passage branches and the fluid passageway comprises multiple elongated fluid passage branches; and a programmable controller configured to control supply modes of the multiple elongated gas passage branches and the multiple elongated fluid passage branches independently, wherein each elongated gas passage branch has a first end connected to a main gas passage and a second end connected to a gas opening, each of the multiple elongated fluid passage branches has a first end connected to a main fluid passage and a second end connected to a fluid opening, wherein the multiple elongated gas passage branches and the multiple elongated fluid passage branches are arranged in an interwoven honeycomb pattern, and the programmable controller adjusts a distribution of the carrier gas based on a pattern density of the one or more fluids previously sprayed onto the semiconductor wafer.

15. The semiconductor apparatus of claim 14, wherein the multiple elongated gas passage branches and the multiple elongated fluid passage branches are arranged in an array in an alternate fashion.

16. The semiconductor apparatus of claim 14, wherein the first nozzle includes a first valve adjustable to cause a non-linear gas distribution on the semiconductor wafer.

17. The semiconductor apparatus of claim 14, wherein a given one of the multiple elongated gas passage branches is surrounded by six of the multiple elongated fluid passage branches.

18. The semiconductor apparatus of claim 17, wherein a gap between the given one of the multiple elongated gas passage branches and an adjacent one of the multiple elongated fluid passage branches is less than a gap between the given one of the multiple elongated gas passage branches and its nearest elongated gas passage branch.

19. The semiconductor apparatus of claim 14, wherein the multiple elongated gas passage branches including a first elongated gas passage branch and a second elongated gas passage branch, the multiple elongated fluid passage branches including a first elongated fluid passage branch, the first elongated gas passage branch comprises a first valve and the first elongated fluid passage branch comprises a second valve, wherein the first valve is controllable independent from the second valve.

20. The semiconductor apparatus of claim 14, wherein a diameter of the multiple elongated fluid passage branches increases gradually from a center of the second nozzle towards edges of the second nozzle.

* * * * *